(12) United States Patent
Hirler et al.

(10) Patent No.: US 8,415,219 B2
(45) Date of Patent: Apr. 9, 2013

(54) METHOD OF MANUFACTURING A DMOS TRENCH TRANSISTOR

(75) Inventors: Franz Hirler, Isen (DE); Helmut Strack, München (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 11/638,612

(22) Filed: Dec. 13, 2006

(65) Prior Publication Data

US 2007/0099373 A1    May 3, 2007

Related U.S. Application Data

(62) Division of application No. 10/651,866, filed on Aug. 29, 2003, now abandoned.

(30) Foreign Application Priority Data

Aug. 29, 2002 (DE) .................. 102 39 861

(51) Int. Cl.
*H01L 21/336* (2006.01)
(52) U.S. Cl. ......... 438/270; 438/268; 438/589; 257/330
(58) Field of Classification Search .......... 438/268–272, 438/589; 257/330–342
See application file for complete search history.

(56) References Cited

U.S. PATENT DOCUMENTS

| 5,405,794 | A | * | 4/1995 | Kim ............................ 438/270 |
| 5,592,005 | A | | 1/1997 | Floyd et al. |
| 6,391,699 | B1 | * | 5/2002 | Madson et al. ............. 438/212 |
| 6,580,474 | B1 | * | 6/2003 | Ahn et al. .................... 349/43 |
| 6,765,247 | B2 | | 7/2004 | Beasom |

FOREIGN PATENT DOCUMENTS

| EP | 0 747 966 A2 | 12/1996 |
| EP | 1 054 451 A2 | 11/2000 |
| EP | 1 096 573 A2 | 5/2001 |

OTHER PUBLICATIONS

Grant, D.A. et al.: "Power MOSFETS—Theory and Applications", John Wiley & Sons Inc., 1989, pp. 74-79.

* cited by examiner

*Primary Examiner* — Ori Nadav
(74) *Attorney, Agent, or Firm* — Dicke, Billig & Czaja, PLLC

(57) ABSTRACT

To attain a comparatively high breakdown voltage at a high avalanche strength and with the physical size simultaneously being as small as possible, the invention proposes constructing a transistor device in a semiconductor material region in which a first source/drain region is used as a source region and in which the source region has a comparatively reduced surface charge or surface charge density.

16 Claims, 9 Drawing Sheets

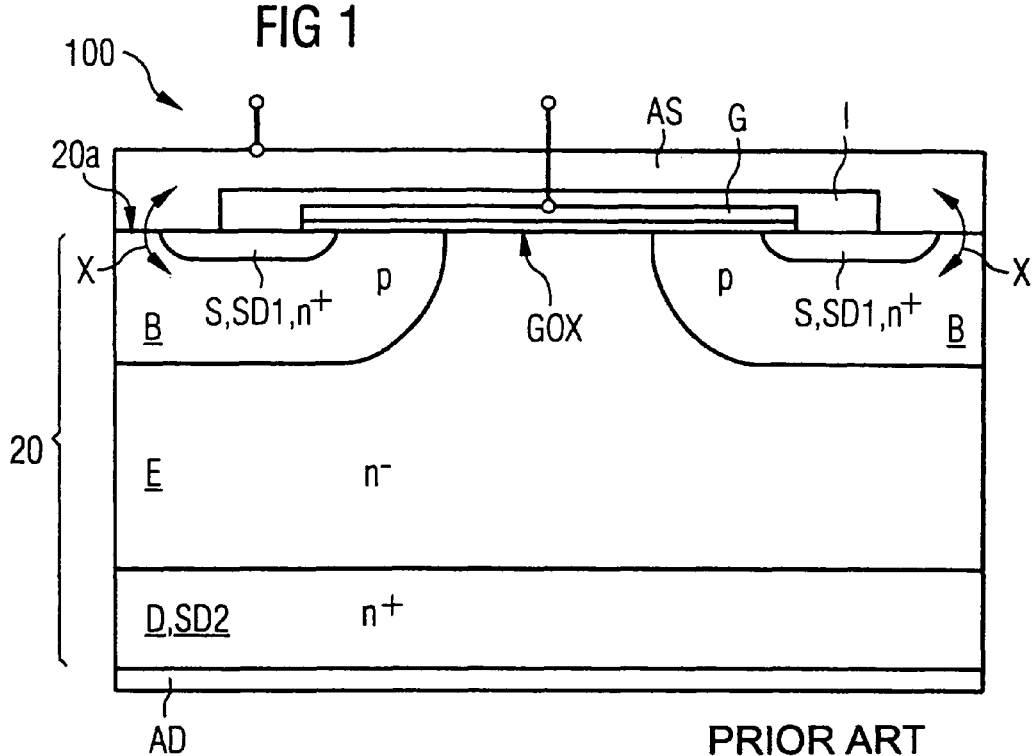
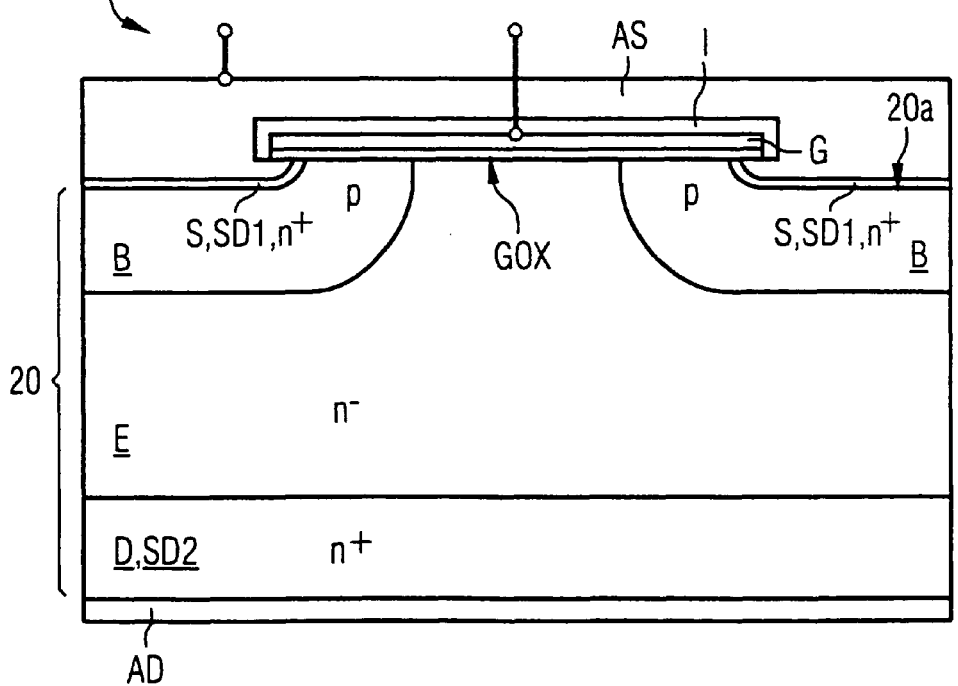

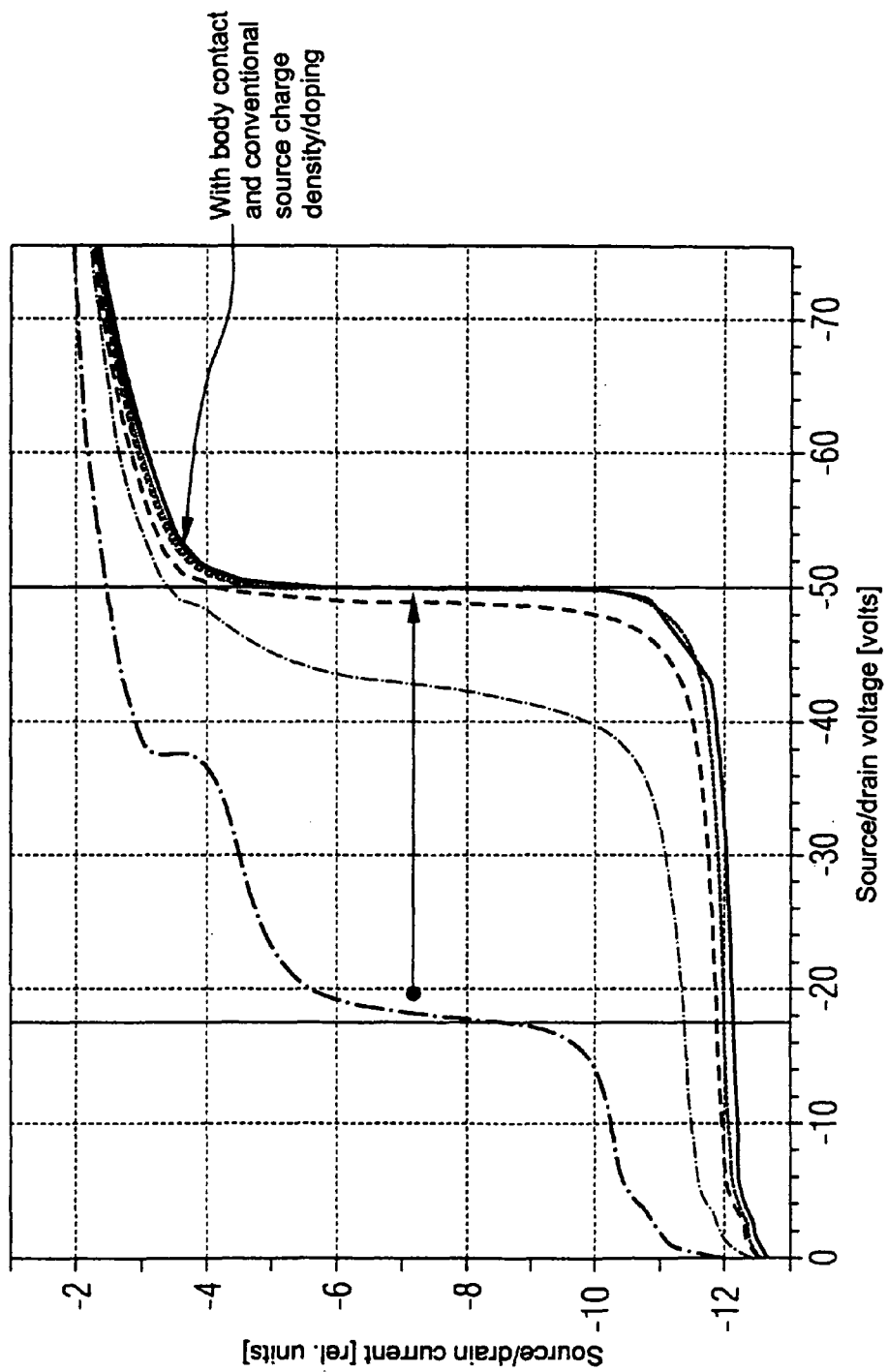

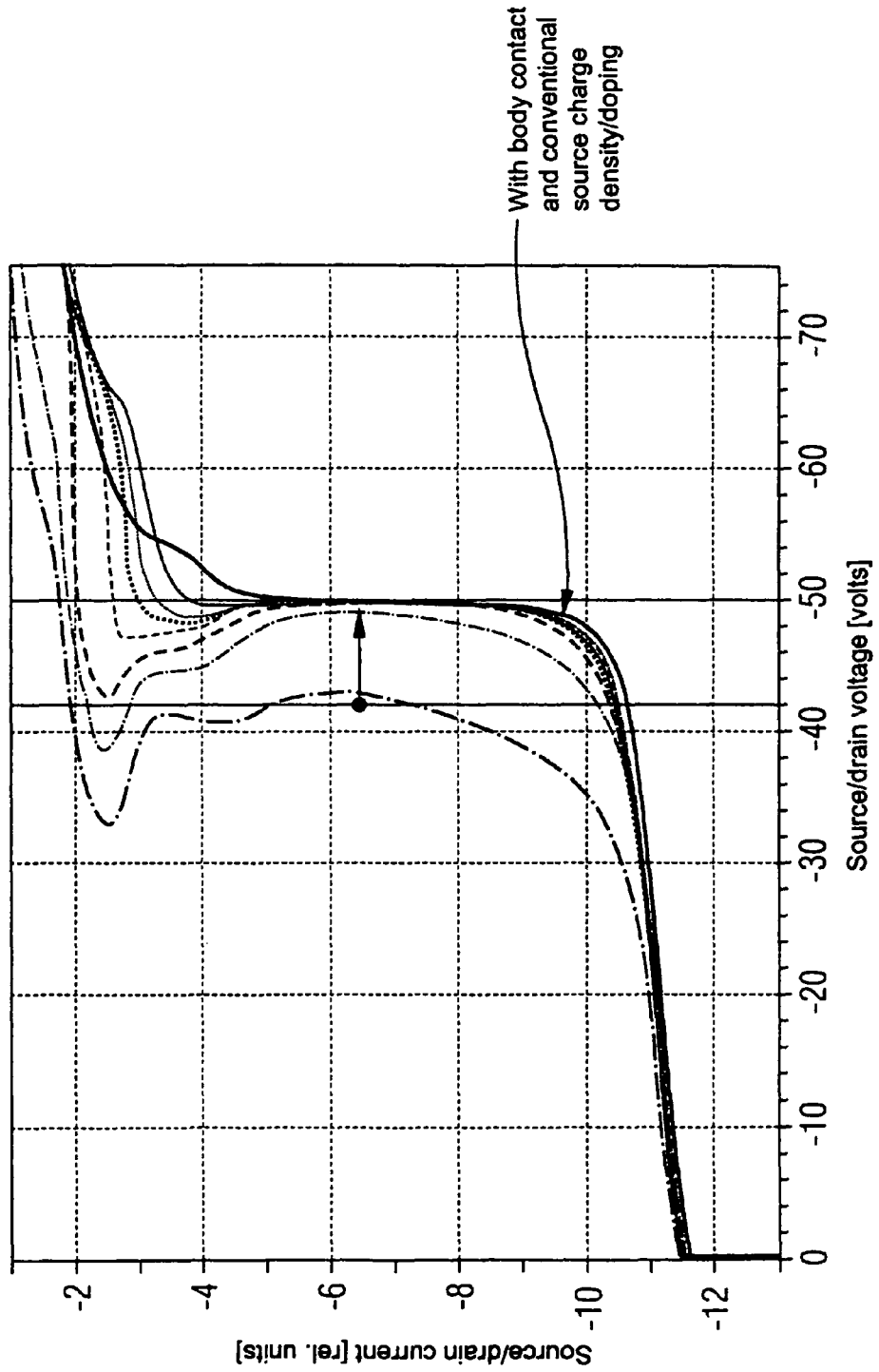

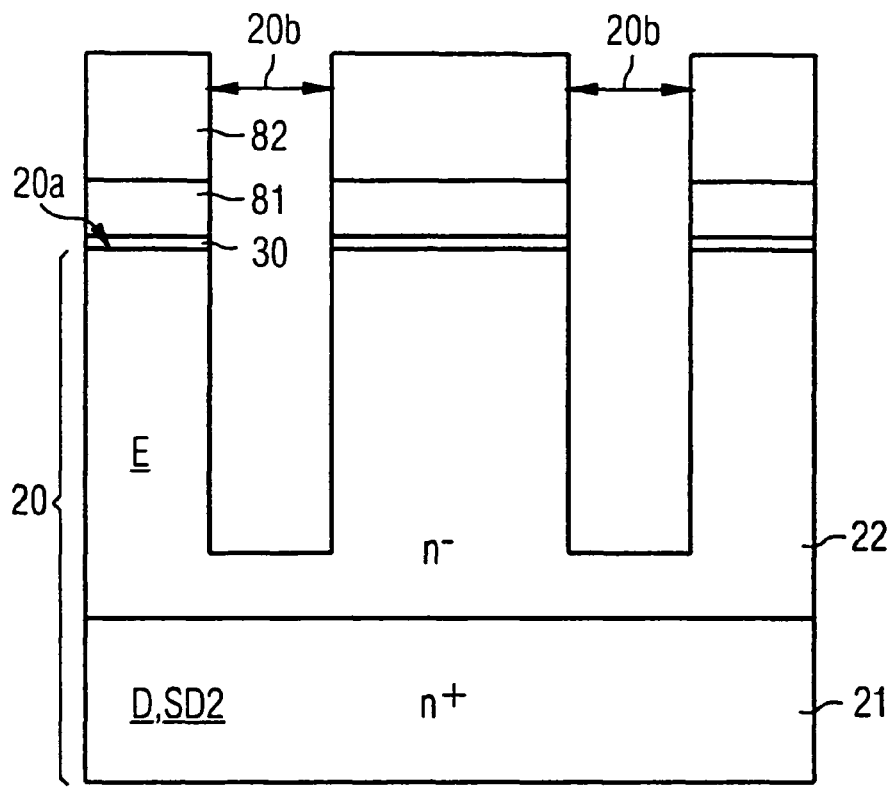
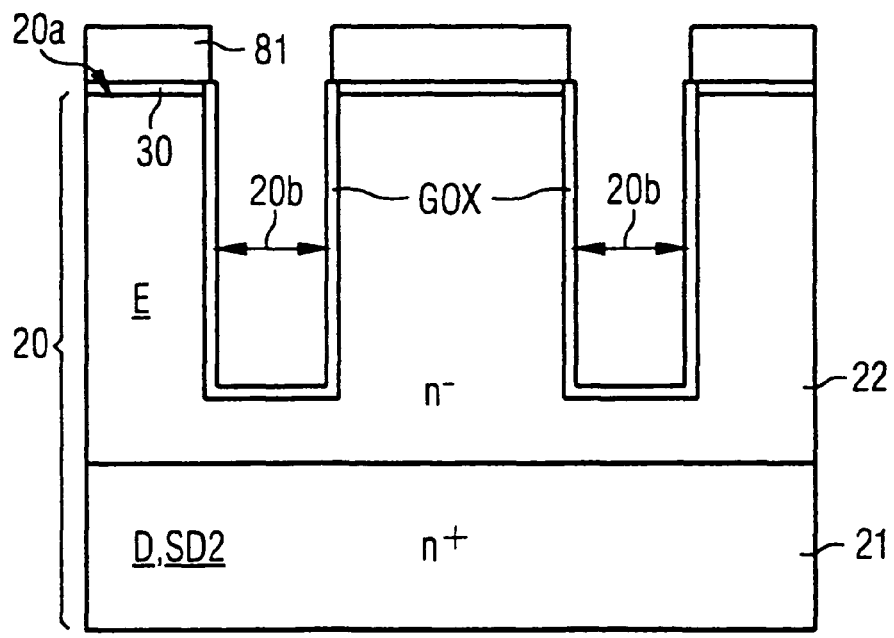

METHOD OF MANUFACTURING A DMOS TRENCH TRANSISTOR

CROSS-REFERENCE TO RELATED APPLICATIONS

This is a division of U.S. patent application Ser. No. 10/651,866, filed Aug. 29, 2003; the application also claims the priority, under 35 U.S.C. §119, of German patent application DE 102 39 861.5, filed Aug. 29, 2002; the prior applications are herewith incorporated by reference in their entirety.

BACKGROUND OF THE INVENTION

Field of the Invention

The invention relates to a method for manufacturing an integrated semiconductor transistor device with parasitic bipolar transistor and, in particular, to a trench power transistor having a transparent source region.

In the further development of transistor devices in semiconductor regions, particularly of integrated transistor devices and also particularly in the case of power transistors of the DMOS type, crucial parameters for the design are the breakdown voltage of the transistor device, the avalanche strength of the transistor device, and the physical size.

To be able to realize adequate avalanche strength with a simultaneously high breakdown voltage, particular design measures normally need to be observed as a necessity for the layout of the transistor assembly. Thus, in the case of power transistors, it is necessary for a body region to be connected to the electrical potential at which the source region of the power transistor is situated during operation, and this connection should be as good as possible. For such a contact to be made or for such a connection, the design measures required therein mean that it is not always possible to implement space savings for very large scale integration and a particularly low turn-on resistance $R_{on} \times A$.

SUMMARY OF THE INVENTION

It is accordingly an object of the invention to provide a method for manufacturing an integrated semiconductor transistor device with parasitic bipolar transistor in which it is possible to realize an adequate avalanche strength for a simultaneously high breakdown voltage without an excessive space requirement or to realize increased avalanche strength for a given geometry.

The object is achieved by the invention by providing a transistor device in a semiconductor material region that has a source/drain region, a second source/drain region, a gate region and a body region produced between the source/drain regions. During operation, the source/drain region can be used as the actual source region or as the source, while the second source/drain region is used as the actual drain region or drain. Depending on the structuring and the electrical potentials applied, the respective operation can also be provided conversely, however. The inventive transistor device has a provision for the first source/drain region, used as the source region, to be designed to have a comparatively reduced surface charge and/or surface charge density (i.e., area charge density). Provision is also made for the configuration of the transistor device to produce a bipolar transistor in parasitic form. Specifically, the first source/drain region, which is used as the source region during operation, forms the emitter, the second source/drain region, which is used as drain region during operation, forms the collector, and the body region forms the base. In the case of the inventive solution, the effect achieved by this is that the current gain factor of the bipolar transistor in parasitic form is designed to be sufficiently low such that the breakdown voltage of the underlying transistor device is not reduced.

This advantage is obtained even if no or at most comparatively poor electrical contact is made with the body region by the first source/drain region, which is used as the source region during operation, or by a connecting region of the first source/drain region such that the body region is not or is comparatively poorly connected to a source potential applied during operation.

These measures are taken in order to ensure a high avalanche strength for the highest possible scale of integration, i.e. for a small physical size, while simultaneously having a high breakdown voltage. Both measures can also be provided together.

The low current gain factor can be utilized in order to increase the avalanche strength in comparison with conventional transistors for a given geometry.

It is also advantageous if, in line with one preferred embodiment of the inventive transistor device, the first source/drain region, which is used as the source region, is formed from a semiconductor material which has a comparatively lower bandgap than the semiconductor material of the body region, particularly 100 meV lower than in the case of silicon.

Particularly in order to produce the additional material layer, the material of the first source/drain region can exclusively be formed between the connecting region of the first source/drain region and the body region such that at most indirect electrical contact is made between the body region and the connecting region of the first source/drain region. This measure thus means that no direct contact is made between the connecting region of the first source/drain region and the body region, e.g. via a metallization.

In one alternative embodiment of the inventive transistor device, the transistor device is in the form of a field-effect transistor device, a power transistor device, a DMOS transistor device, a planar transistor device and/or a trench transistor device.

In one advantageous development of the inventive transistor device, the surface charge density (i.e., area charge density) in the first source/drain region is reduced, from a range between approximately $10^{14}$ cm$^{-2}$ and approximately $10^{16}$ cm$^{-2}$, to a range between approximately $10^{9}$ cm$^{-2}$ and approximately $10^{13}$ cm$^{-2}$. In another advantageous development of the inventive transistor device, the transistor device is in the form of a DMOS transistor device, the body region is designed to be not connected to the source region or to the connecting region of the source region, the emitter charge (i.e., area charge density) or the charge in the first source/drain region is designed to be reduced to such an extent that, as a result, the breakdown voltage, particularly in the case of small currents, is reduced by at most 15% as compared with the breakdown voltage when there is contact with the body region.

In another advantageous development of the inventive transistor device, the transistor device is in the form of a trench DMOS transistor device, the body region is designed to be not connected to the source region or to the connecting region of the source region, and the emitter charge (i.e., area charge density) and particularly the charge in the first source/drain region is designed to be reduced to such an extent that the breakdown voltage is reduced by at most 15% as compared with the breakdown voltage when the body region is in contact with the source region or with the connecting region of the source region.

A few explicit examples are explained below.

By way of example, a planar DMOS transistor or a trench DMOS transistor can be provided in which the body region is not connected to the source region or to the connecting region of the source region and in which the emitter charge is respectively reduced to such an extent that the breakdown voltage, particularly in the case of small currents, is reduced by at most 15% as compared with the breakdown voltage when the body region is connected to the source region or to the connecting region of the source region.

In another embodiment of the inventive transistor device, the latter is in the form of a trench DMOS transistor, where the source region is produced using a semiconductor material having a bandgap which is smaller than that of the semiconductor material in the body region. In this case, the body region is made of silicon, for example, and the source region is made of $Si_{1-x}Ge_x$. In addition to silicon and semiconductors with a low bandgap, amorphous semiconductors, amorphous silicon and amorphous metal are also conceivable.

In this case, provision is made, in particular, for the surface charges or the surface charge density (i.e., area charge density) of the source region to be designed so as to be reduced to such an extent that the breakdown voltage, particularly in the case of small currents, is designed so as to be reduced by at most 15% as compared with the breakdown voltage when the body region is in contact with the source region or with the connecting region of the source region.

In another embodiment of the inventive transistor device, the latter is likewise in the form of a trench DMOS transistor and has an unconnected body region. In this case, the source region is formed from a semiconductor material that has a smaller bandgap than the semiconductor material of the body region. In this context, the body region is made of silicon, and the source region is made of $Si_{1-x}Ge_x$. In addition to silicon and semiconductors with a low bandgap, amorphous semiconductors and amorphous silicon are also conceivable.

In one alternative embodiment, the transistor device is in the form of a trench DMOS transistor and has a body region that is not connected to the source region or to the connecting region of the source region. In this case, the source region is formed from a semiconductor material whose conduction band edge has a lower energy level than the conduction band edge of the semiconductor material in the body region. In this context, the conduction band edges are compared with one another in the undoped case or undoped state.

In another alternative, the transistor device is in the form of a trench DMOS transistor and has a body region that is not connected to the source region or to the connecting region of the source region. In this case, the source region is formed from a semiconductor material whose valency band edge has a higher energy level than the valency band edge of the semiconductor material in the body region. In this context, the valency band edges are likewise compared with one another in the undoped case or undoped state.

Another alternative is that the transistor device is in the form of a trench DMOS transistor and has a body region which is not connected to the source region or to the connecting region of the source region, with the charge or charge density (i.e., area charge density) of the source region being designed so as to be reduced to such an extent that the breakdown voltage, particularly in the case of small currents, is reduced only to a small extent as compared with the breakdown voltage that is obtained when the body region is in contact with the source region or with the connecting region of the source region.

In this case, particularly for making contact with the source region, a dopant is provided which allows good contact, but whose charge is electrically inactive in the off case. This can be selenium, in particular.

In another alternative of the inventive transistor device, provision is made for the source region to be in the form of a thin structure, and can be, for example, 10 nm. In this case, an amorphous or polycrystalline and undoped, weakly doped or highly doped semiconductor material is then produced on the source region for the purpose of making contact with the source region. A metallization is then produced on the highly doped semiconductor layer.

In another alternative, the source region of the inventive transistor device and particularly of a DMOS transistor device can be in epitaxially deposited form.

In this case, provision is made for the source region, particularly of a DMOS transistor, to be produced epitaxially, specifically from a semiconductor material having a relatively small bandgap, having a conduction band edge, which has a relatively low energy level or having a valency band edge which has a relatively high level.

In this case, the charge density (i.e., area charge density) or charge of the source region, in particular, is less than $10^{14}$ $cm^{-2}$.

The invention is explained in more detail below with the following in mind:

For adequate avalanche strength in a DMOS transistor, it is conventionally important for there to be good connection between the body region and the source potential. If the body region is not connected, the breakdown voltage falls to the $V_{CE0}$ voltage of the parasitic bipolar transistor, whose emitter is formed by the source region, whose base is formed by the body region and whose collector is formed by the drain region.

The avalanche strength of a DMOS transistor without a connected or with a poorly connected body region, on the other hand, is conventionally very low, since the hole current biases the base of the parasitic bipolar transistor, and the latter turns on. However, the poor ability of bipolar transistors to be connected in parallel results in a large portion of the current being concentrated in the weakest cell and hence in destruction during avalanche mode even with small currents.

As already stated, the problem is conventionally solved by virtue of the best possible connection between the body region and the source potential. Since the connection always requires additional space, it is opposed by a further reduction in the size of the cell.

The invention proposes not connecting the body region, or connecting it only poorly, and/or reducing the current gain factor "a" of the parasitic bipolar transistor to such an extent that the breakdown voltage is not reduced and possibly even to ensure a high avalanche strength.

To this end, it is proposed, in particular, that the surface charge (i.e., area charge density) be drastically reduced in the source region and/or that the source region be produced from a semiconductor having a lower bandgap than the body region.

The advantage of this structure is in the space gain by dispensing with the body contact. This means that the cell can be reduced in size to a much greater extent, as a result of which a lower turn-on resistance is achieved. In addition, the transistor is off in the reverse mode, which is advantageous for a large number of applications.

One inventive idea is to dispense with a body contact connection and/or drastic reduction of the source charge (i.e., area charge density), particularly in connection with tailoring the bandgap.

The following exemplary embodiments of designs and methods are mentioned by way of explanation:

a) A planar DMOS transistor whose body is not connected to the source region or to the connecting region of the source region. The emitter charge (i.e., area charge density) is reduced to such an extent that the breakdown voltage (in the case of small currents) is reduced by at most 15% as compared with the breakdown voltage with a body contact.

b) A trench DMOS transistor whose body is not connected to the source region or to the connecting region of the source region. The emitter charge is reduced to such an extent that the breakdown voltage is reduced by at most 15% as compared with the breakdown voltage with a body contact.

c) A trench DMOS transistor whose source region is made of a semiconductor material having a smaller bandgap than the semiconductor material of the body region, e.g. a body region made of silicon, and a source region made of $Si_{1-x}Ge_x$. In addition to silicon and semiconductors with a low bandgap, amorphous semiconductors, amorphous silicon or amorphous metal are also conceivable.

d) A trench DMOS transistor whose body is not connected to the source region or to the connecting region of the source region. The source region is made of a semiconductor material with a smaller bandgap than the semiconductor material of the body region, e.g. a body region made of silicon, and a source region made of $Si_{1-x}Ge_x$. In addition to silicon and semiconductors with a low bandgap, amorphous semiconductors, amorphous silicon or amorphous metal are also conceivable.

e) As c), but the surface charge (i.e., area charge density) of the source region is reduced to such an extent that the breakdown voltage (in the case of small currents) is reduced by at most 15% as compared with the breakdown voltage with body contact.

f) A trench DMOS transistor whose body is not connected to the source region or to the connecting region of the source region. The source region is made of a semiconductor material whose conduction band edge has a lower energy level than the conduction band edge of the semiconductor material from which the body region is made. Band edges are compared in the undoped case.

g) A trench DMOS transistor whose body is not connected to the source region or to the connecting region of the source region. The source region is made of a semiconductor material whose valency band edge has a higher energy level than the valency band edge of the semiconductor material from which the body region is made. Band edges are compared in the undoped case.

h) A trench DMOS transistor whose body is not connected, in which the source charge (i.e., area charge density) is reduced to such an extent that the breakdown voltage (in the case of small currents) is reduced only to a small extent as compared with the breakdown voltage with a body contact. In order to make contact with the source region, a dopant is used which allows good contact, but whose charge is not electrically active in the off case, e.g. selenium.

i) In addition to the structure described previously, a structure is also conceivable in which an amorphous or polycrystalline undoped, weakly doped or highly doped semiconductor layer holding the metallization is used on the thin source region for the purpose of making contact with the source region. The source region can also be made of polycrystalline or amorphous semiconductor material, particularly of silicon, or of amorphous metal.

j) A fabrication method involves epitaxially depositing the source region of a DMOS transistor.

k) A fabrication method in which the source region of a DMOS transistor is formed epitaxially and from a semiconductor material having a relatively small bandgap with a conduction band edge having a relatively low energy level or with a valency band edge having a relatively high level.

l) The two exemplary embodiments above, where the source charge is less than $10^{14}$ cm$^{-2}$.

m) A fabrication method for a planar or trench DMOS transistor, where the body and epi-regions and also the gate oxide and the gate electrode and the gate electrode's insulation have already been produced. Semiconductor material in the body region is etched away until a region directly adjoining the gate oxide has been removed opposite the gate electrode. Next, (selective) epitaxy is used to apply the source region. This can involve the use of a semiconductor with a relatively small bandgap, in particular.

n) In an example of a fabrication method for a trench DMOS transistor, the following steps can be performed, by way of example:

Provide a substrate and epi;

Introduce the body region (possibly even at a later time);

Trench mask possibly including a plurality of layers, at least some of which can be removed selectively with respect to the later insulating layer (e.g. oxide on nitride, buffer layer made of oxide or poly below the nitride);

Etch the trench mask and the trenches;

Optionally remove a portion of the trench mask (oxide is required only for trench etching);

Apply the gate oxide;

Introduce the gate electrode and back-etch down to below the silicon top edge or the nitride top edge;

Apply an insulation, e.g. oxide;

Remove the portion of this insulation (and also of the top layer of the trench mask, if still present) protruding above the rest of the trench mask, e.g. using CMP, so that the gate electrode is still completely covered;

Remove the rest of the trench mask selectively with respect to the insulation;

If necessary, back-etch the silicon body down to below the gate electrode;

Optionally deposit an insulating layer or oxidation and then anisotropically back-etch the insulating layer or the oxide, so that a vertical spacer or a vertical oxide thickening is left over;

Possibly introduce the body region in this region, ideally implanting and diffusing before the anisotropic spacer etching. When there is an "oxide thickening", the maximum doping should come to rest below the oxide thickening, preferably in the region of the "bird's beak"; In the region of the oxide thickening, the body doping should be low enough so that the region does not determine the threshold voltage, despite a relatively great insulation thickness;

Selectively epitaxially grow the source region, possibly from a semiconductor with a relatively small bandgap;

Optionally deposit an insulating layer and anisotropically back-etch the insulating layer, so that a vertical spacer is left over;

Deposit a metallization; an amorphous or polycrystalline semiconductor layer can possibly be used as an intermediate layer to provide better connection for the source region;

Besides silicon and semiconductors with a relatively low bandgap, amorphous semiconductors, amorphous silicon or amorphous metal are also conceivable; and Passivate.

Other features which are considered as characteristic for the invention are set forth in the appended claims.

Although the invention is illustrated and described herein as embodied in a method for manufacturing an integrated semiconductor transistor device with parasitic bipolar transistor, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 1 is a schematic, cross-sectional side view of a first conventional planar transistor;

FIG. 2 is a schematic, cross-sectional side view of a first embodiment of the inventive transistor device;

FIGS. 4 to 6 are graphs which explain the breakdown characteristic curves of various embodiments of the inventive transistor device as compared with the prior art; and FIGS. 7A to 7H are schematic cross-sectional views from the side to illustrate various intermediate stages in fabricating a transistor device in accordance with the invention.

DESCRIPTION OF THE PREFERRED EMBODIMENTS

Figure 3A:
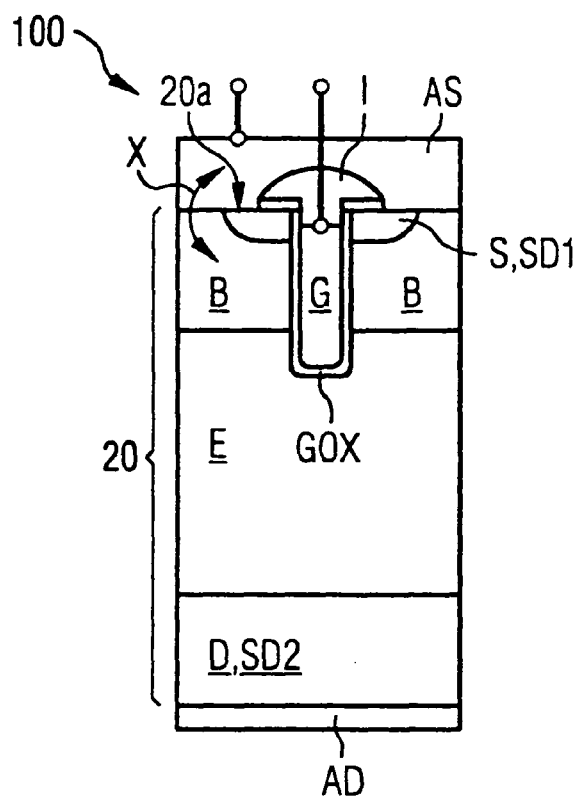
FIG. 3A is a schematic, cross-sectional side view of a conventional transistor device.

Referring now to the figures of the drawing in detail and first, particularly, to FIG. 1 thereof, there is shown a schematic cross-sectional view from the side of a conventional planar DMOS transistor 100. A semiconductor material region 20 has a planar surface region 20a and a bottom with a second source/drain region SD2 that is used as drain region D. The second source/drain region SD2 has an n$^+$ doping. The semiconductor material region 20 has a subsequent epitaxial intermediate region E with n$^-$ doping. The semiconductor material region 20 also has bulk or body regions B with a p doping and first source/drain regions SD1, with a n$^+$ doping, used as source regions S. Provided on the surface region 20a of the underlying semiconductor material region 20 are the gate electrode G, an insulating region I which shields the gate electrode G, and a metallization region used as connecting region AS for the source region S. The insulating region I insulates the gate electrode G and the connecting region AS for the source region S from one another electrically. To complete the gate structure, a gate oxide region GOX is also produced between the gate electrode G and the surface region 20a of the semiconductor material region 20.

FIG. 1 shows that the first source/drain regions SD1 are produced so as to be physically bounded at the sides, which means that direct contact is produced with the metallization of the connecting region AS and at the same time also direct contact can be made, namely via the regions X, between the body regions B and the connecting regions AS for the source region S. In this way, the body regions B and the source regions S can have the same potential applied to them via the connecting region AS.

On the back of the configuration of the conventional transistor device 100 in FIG. 1, a connecting region AD for the drain region D is also produced.

In the text below, elements and assemblies which have identical or similar functions or identical or similar structures are always denoted by the same reference characters, and a detailed description is not given or repeated for each occurrence.

In comparison therewith, FIG. 2 now shows a schematic, cross-sectional side view of a planar DMOS transistor 10 constructed in accordance with the invention.

In contrast to the prior art embodiment shown in FIG. 1, the view in FIG. 2 for the first inventive transistor device 10 shows that, in that case, the first source/drain regions SD1 having n$^+$ doping are designed to be not physically bounded at the sides, which means that direct contact is not possible between the underlying body regions B having p-doping and the metallization region of the connecting region AS for the source region S. The source regions S are thus used as a type of insulation or shielding between the body region B and the source potential which is supplied to the first source/drain region SD1, as source region, via the connecting region AS during operation.

Figure 3B:
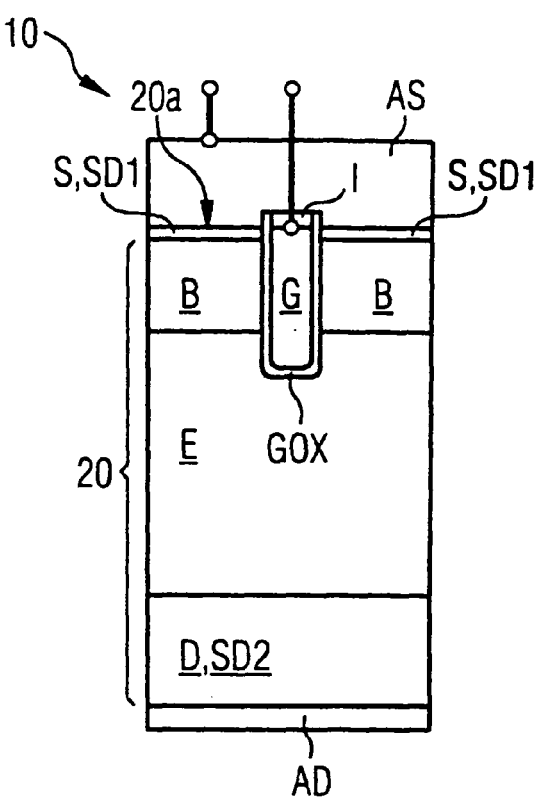
FIG. 3B another embodiment of the inventive transistor device.

FIGS. 3A and 3B in turn show, in comparison with one another, a conventional transistor device 100 and another transistor device 10 constructed in accordance with the invention. These are each trench DMOS transistor devices in which the gate electrode G is not produced on the surface region 20a of the underlying semiconductor material region 20, but rather projects into a trench in the bulk of the semiconductor material region 20. The trench extends from the surface region 20a of the semiconductor material 20 via the body region B as far as the epitaxial region E. To produce the gate structure G, the trench is additionally produced with a respective gate oxide GOX lining it. In the top region of the trench, a respective insulating region I is provided in order to shield the gate electrode G, and is, for example, made of polysilicon or the like, from the metallization of the connecting region AS for the first source/drain region SD1 serving as the actual source region S.

From the comparison of the conventional embodiment of the FIG. 3A with the inventive embodiment of FIG. 3B, it can be seen that the conventional transistor device 100 in FIG. 3A again has the source regions S designed so as to be physically bounded at the sides, which means that there is again direct electrical contact X between the body regions B and the connecting regions AS, namely the corresponding metallizations, so that the body regions B and the source regions S likewise have the same electrical potential applied to them during operation via the common metallization of the connecting region AS. The connections X can also be interrupted in the third dimension, e.g. the depth in the drawing plane of the figure.

In contrast to this, the source regions S of the inventive transistor device 10 in FIG. 3B have no such physical bounding at the sides, which means that in this case the source regions S shield the body regions B from the source potential that is supplied via the metallization of the connecting region AS.

Considered as a whole, the result is thus that the lack of bounding for the first source/drain regions SD1 and particularly for the source regions S and hence for the missing contact regions X between the connecting regions AS for the source regions S and the body regions B means that the body regions B are not connected or are connected only poorly to the source potential.

In this context, poorly connected means that the body contacts X are produced, by way of example, in a strip design in the third dimension with relatively large spacings, without limiting the size of the cell. For a conventional structure, this can result in a reduced avalanche strength. With the inventive structure, the full breakdown voltage and a very high avalanche strength are achieved.

Figure 5:
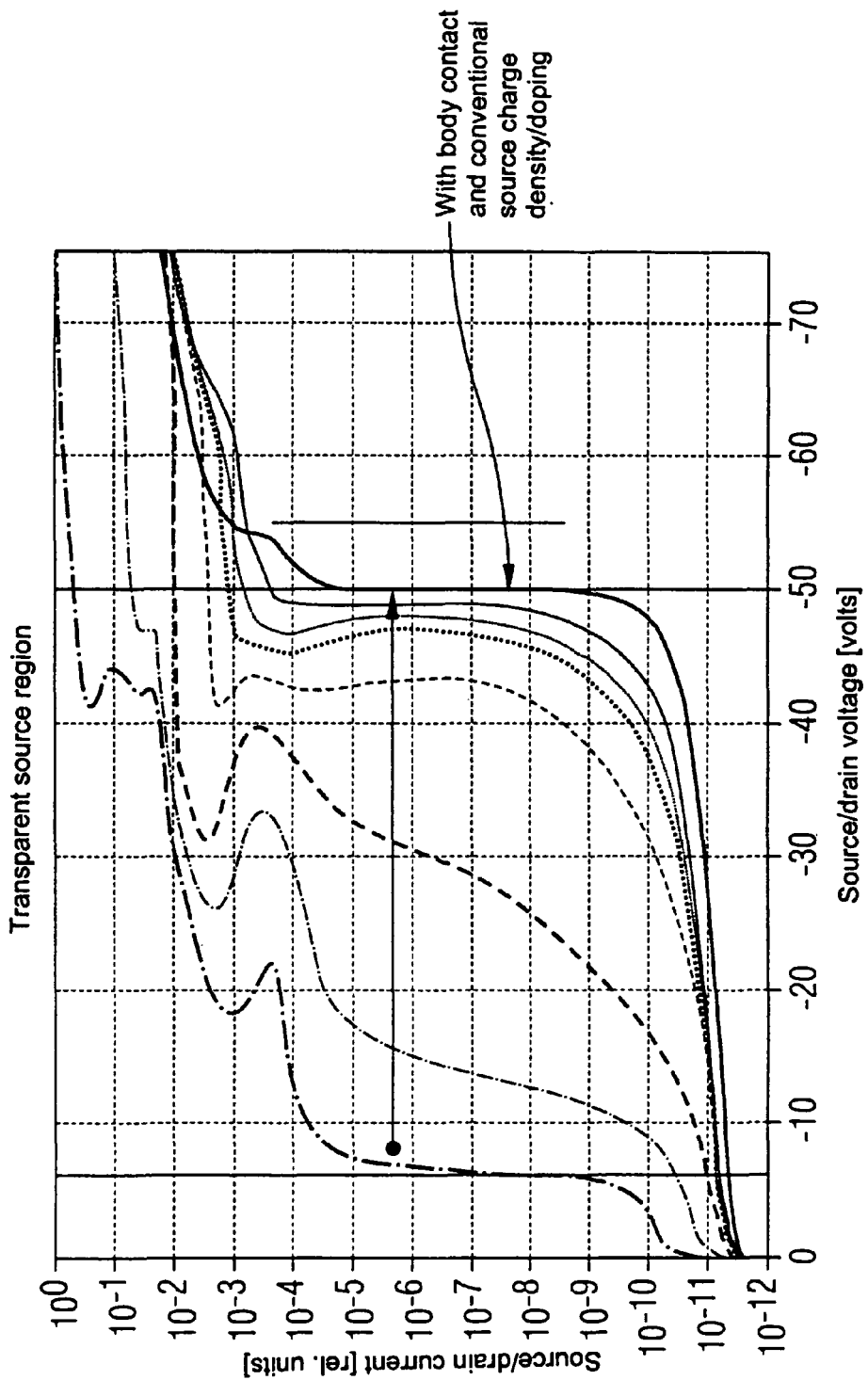

The subsequent FIGS. 4 to 6 show graphs which explain the "breakdown characteristic curves" for the inventive transistor devices 10 in comparison with the prior art. All the graphs show the respective source/drain current as a function of the source/drain region voltage. In this case, essentially the curve of a respective asymptotically saturating step function is obtained, in each case qualitatively, with the position of the step respectively defining the breakdown voltage at which there is a transition from comparatively small flows of current to comparatively large flows of current.

FIG. 4 shows a family of breakdown characteristic curves for a p-channel trench DMOS transistor for various source surface charge densities. From left to right in the direction of the arrow, the source surface charge density (i.e., area charge density) is reduced from $2.8 \times 10^{15}$ cm$^{-2}$ to $5.4 \times 10^9$ cm$^{-2}$, in line with the invention. On the far right, the breakdown characteristic curve for a p-channel trench DMOS transistor from the prior art having a source surface charge density (i.e., area charge density) of $2.2 \times 10^{15}$ cm$^{-2}$ is shown. FIG. 4 thus shows that, as the source surface charge densities are reduced from left to right in the direction of the arrow, the breakdown voltages can be raised from comparatively low values at approximately 16 V to approximately 50 V for a source surface charge density (i.e., area charge density) of approximately $2.8 \times 10^{15}$ cm$^{-2}$. This means that, despite the lack of direct body connection, simultaneously reducing the source surface charge density can achieve a low breakdown voltage for the source/drain region path, as in the case of the prior art, in which direct body contact is realized for a high source surface charge density.

FIG. 5 shows a similar response for an n-channel trench DMOS transistor in accordance with the present invention. In the case of this family of curves too, the source surface charge density (i.e., area charge density) is again reduced from left to right from $2.8 \times 10^{15}$ cm$^{-2}$ to $5.4 \times 10^9$ cm$^{-2}$. The result in this case is that, despite not making direct body contact X, the breakdown voltage can be raised from approximately 5 V to approximately 50 V from left to right, which is a value corresponding to that in the prior art for a high source surface charge density of $2.2 \times 10^{15}$ cm$^{-2}$ and when direct body contact X is made.

Finally, in FIG. 6, a concentration dependency, which is not quite so drastic, is observed if, for an inventive n-channel trench DMOS transistor with an $Si_{0.7}Ge_{0.3}$ source region, the source surface charge densities are reduced from $2.8 \times 10^{15}$ cm$^{-2}$ to $5.4 \times 10^9$ cm$^{-2}$ from left to right. In this case, the breakdown voltage is raised from approximately 38 V to approximately 50 V in the prior art, but no noticeable further reduction in the breakdown voltage is obtained after a dose of $1.7 \times 10^{13}$ cm$^{-2}$ for the source surface charge density.

In comparison with the conventional practice with no body contact, the breakdown voltage is raised from 5 V to 38 V in the least favorable case.

In contrast to this, the reductions in the embodiments in FIGS. 4 and 5 are saturated at $1.2 \times 10^{12}$ cm$^{-2}$ and at $8.5 \times 10^{10}$ cm$^{-2}$.

FIGS. 7A to 7H show cross-sectional views of various intermediate stages in the fabrication of an inventive trench DMOS transistor 10.

Figure 7C:
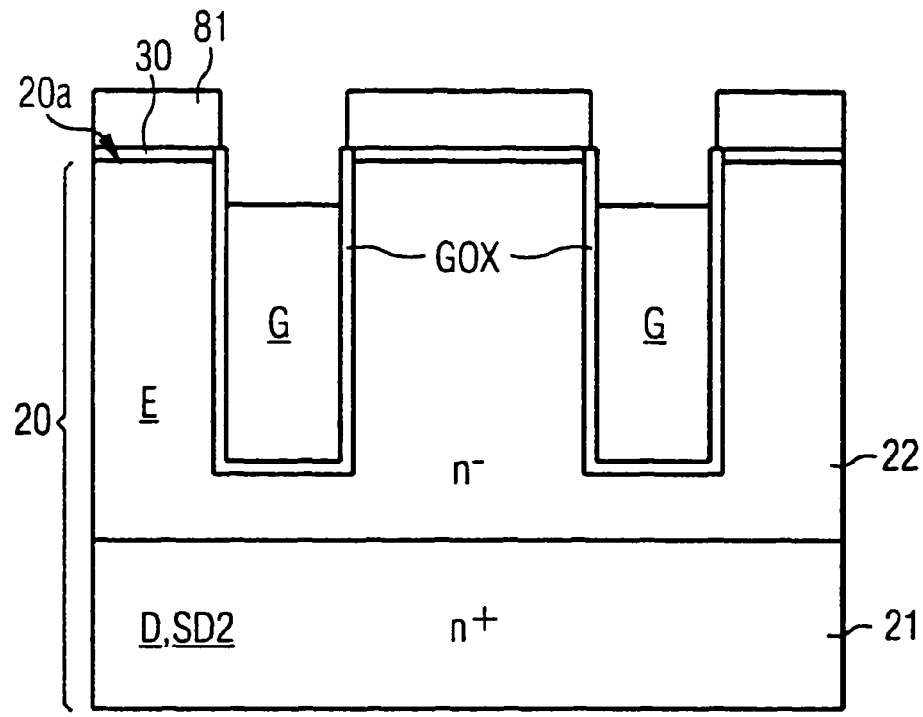

First, a semiconductor material region 20 is provided. This has a planar surface region 20a. In the semiconductor material region 20, doping is used to produce two material layers 21 and 22, the first of which in the embodiment shown in FIGS. 7A to 7H has n$^+$ doping and is used as the second source/drain region SD2 or as the actual drain region D, and the second material layer 22 forms an n$^-$ doped epitaxial layer. After that, a multilayer mask structure is produced on the surface region 20a of the semiconductor material region 20. This mask structure in this embodiment is made of a polysilicon layer 30, of a nitride layer 81 and of an oxide layer 82 which are arranged in this order on the surface region 20a. The trench mask configuration 30, 81, 82 is then structured, and the corresponding trench structures or trenches 20b are produced in the semiconductor material region 20, which do not entirely traverse the epitaxial region 22. This state is shown in FIG. 7A.

In the transition to FIG. 7B, the oxide parts 82 of the trench mask are removed and the gate oxide GOX is produced in trenches 20b and is back-etched.

In the transition to FIG. 7C, the material for the gate electrode G is then introduced and is back-etched down to below the silicon top edge 20a or the nitride layer top edge.

Figure 7D:
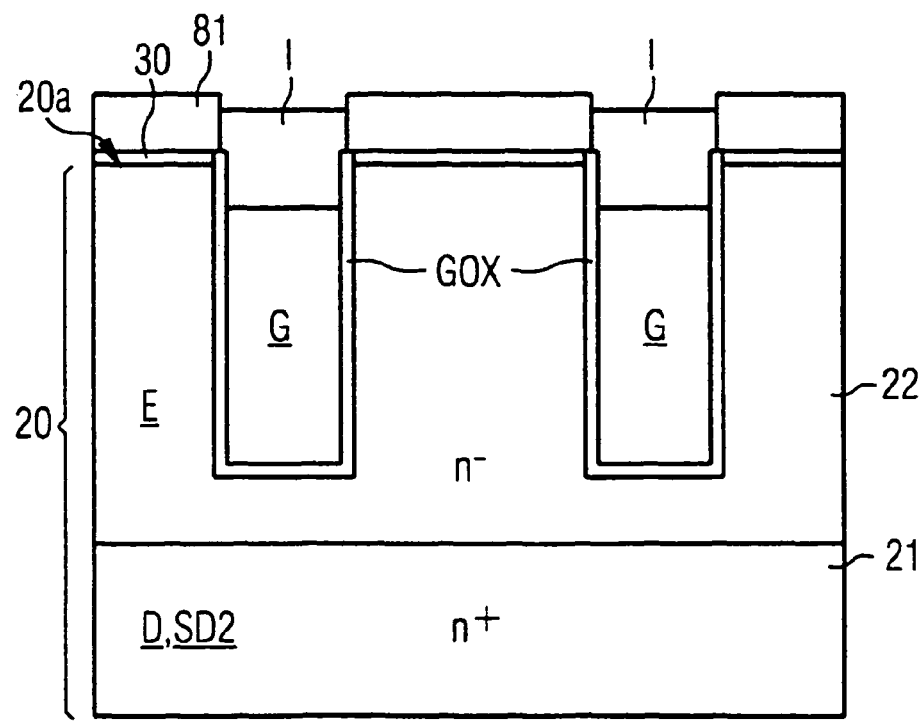

Next, an insulating layer I, for example an intermediate oxide, is then applied and back-etched, for example using CMP, so that the gate electrode G is still completely covered by the intermediate oxide, as shown in FIG. 7D.

Figure 7E:
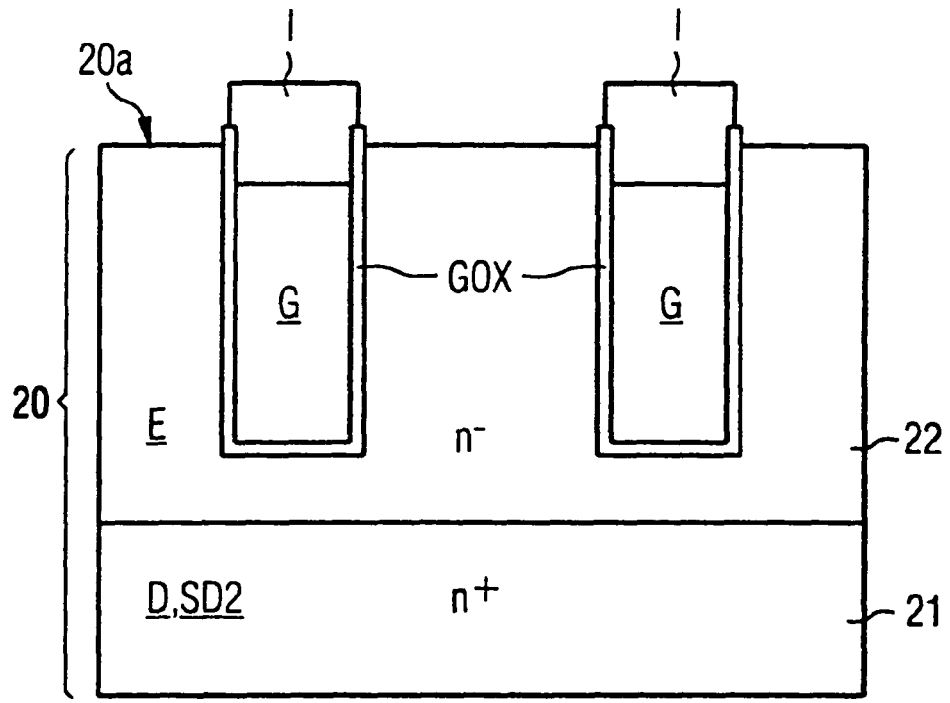

In the transition to the state in FIG. 7E, residues of the trench mask 30, 81 are then removed, if still present. The residues of the trench mask 30, 81 are removed selectively with respect to the insulation.

Figure 7F:
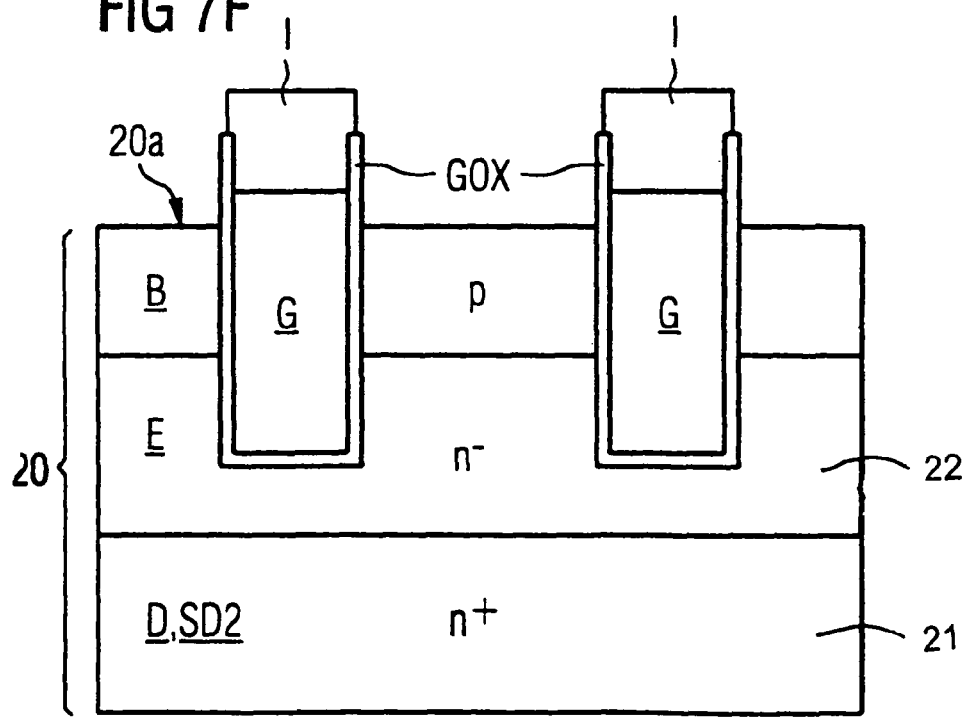

In the transition to FIG. 7F, the silicon body 20 is back-etched down to below the gate electrode G, if required. Optionally, an insulating layer can then be deposited or can be produced by an oxidation and a subsequent anisotropic back-etching. The back-etching then results in a vertical spacer 70 or a vertical oxide thickening.

Next, the body region B is introduced, ideally by an implantation and/or by a diffusion before the anisotropic back-etching for spacer formation. In the presence of an oxide thickening, the maximum doping should come to rest below the oxide thickening, preferably in the region of the bird's beak.

In the oxide thickening, the body doping should be low enough for the region not to determine the threshold voltage, despite a relatively great insulation thickness. This state is shown in FIG. 7F.

Figure 7G:
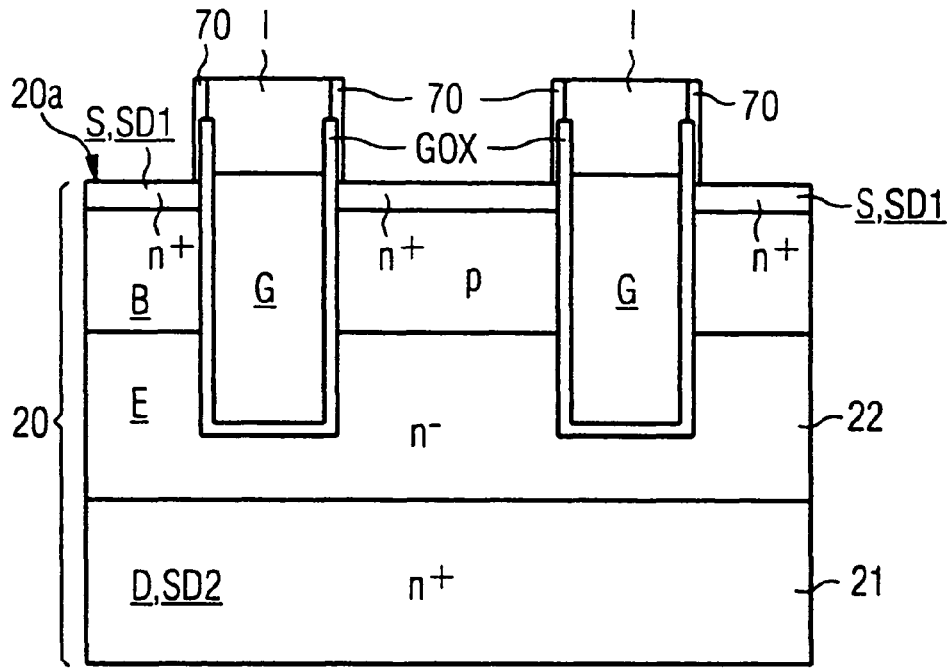

In the transition to FIG. 7G, epitaxial growth is used for selectively producing the source region S as the first source/drain region SD1, to be precise possibly from a semiconductor with a relatively small bandgap. Besides silicon and semiconductors with a relatively low bandgap, amorphous semiconductors, amorphous silicon or amorphous metal are also conceivable.

Figure 7H:
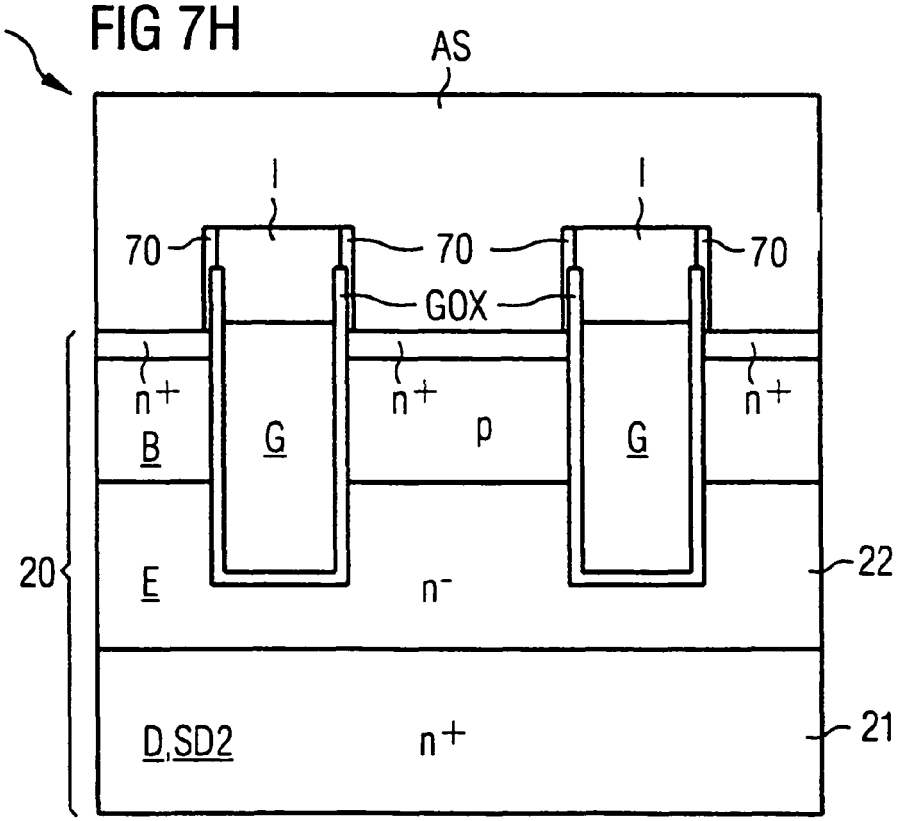

Finally, in the transition to the state in FIG. 7H, a further insulating layer is optionally deposited, with, if appropriate, an anisotropic back-etching of this insulating layer in turn leaving a vertical spacer. A metallization 60 is then produced in order to form the connecting region AS for the first source/drain region SD1 or for the actual source region S.

If appropriate, the surface of the metallization for the connecting region AS is then passivated.

We claim:

1. A method of manufacturing a DMOS transistor, comprising:
    providing a substrate;
    forming in the substrate a drift region and forming, in a trench having a bottom level in the drift region, a gate electrode bounded by a gate insulation layer in the trench, the gate electrode having a first flat top level which adjoins the gate insulation layer;
    back-etching the substrate with the drift region after having formed said gate electrode and said gate insulation layer to a level below the first flat top level of said gate electrode;
    forming a body region in the substrate, the body region being provided on the drift region;
    forming a source region on the body region based on a process of deposition, wherein a second top level of the body region and a third top level of the source region are below the first flat top level of said gate electrode, and wherein the gate insulation layer electrically insulates the gate electrode from the drift region, the body region, and the source region; and
    disposing a metallization region on the source region and the gate insulation layer, wherein the source region covers the whole surface of the body region opposite to the drift region and prevents a direct electrical contact between the metallization region and the body region.

2. The method of claim 1, wherein the source region is formed by epitaxial growth.

3. The method of claim 1, wherein a material used for the source region has a smaller band gap than a band gap of a material used for the body region.

4. The method of claim 3, wherein the material used for the body region comprises Si and wherein $Si_{1-x}Ge_x$ is used as the material for the source region.

5. The method of claim 2, wherein the source region is formed by depositing an amorphous metal material.

6. The method of claim 2, wherein the source region is formed by depositing at least one of an amorphous semiconductor material and a polycrystalline semiconductor material as the contact layer.

7. The method of claim 1, further including the step of forming a connection region for the source region.

8. The method of claim 7, wherein at least one of an amorphous semiconductor material and an amorphous silicon material are used as a material for the connection region formed for the source region.

9. The method of claim 7, wherein an amorphous metal material is used as a material for the connection region formed for the source region.

10. The method of claim 1, wherein the source region is formed having a area charge density in a range from $10^{14}$ $cm^{-2}$ to $10^{16}$ $cm^{-2}$.

11. The method of claim 1, wherein the body region is formed without direct connection to a source potential.

12. The method of claim 1, wherein the metallization region is electrically inactive when the DMOS transistor is in an off-state.

13. The method of claim 1, including forming the body region using one of an implantation process and a diffusion process.

14. A method of manufacturing a DMOS transistor comprising:
    forming a drift region, a gate oxide layer, a gate electrode, and a body region in a semiconductor substrate, the entire surface of the gate electrode having a first flat top level which adjoins the gate oxide layer, wherein the gate oxide layer and the gate electrode are formed on a surface of the semiconductor substrate;
    forming a source region in the semiconductor substrate on the body region, wherein the gate oxide layer insulates the gate electrode from the drift region, the body region, and the source region, and wherein a second top level of the body region and a third top level of the source region are below the first flat top level of said gate electrode;
    forming a gate insulating layer over the gate electrode; and
    forming a connecting metallization region to the source region over the gate insulating layer and the source region, wherein the gate insulating layer insulates the gate electrode from the connecting metallization region, and wherein the source region substantially covers the whole surface of the body region opposite to the drift region and prevents a direct electrical contact between the connecting metallization region and the underlying body region.

15. The method of claim 14, wherein the DMOS transistor comprises a planar type DMOS transistor, and wherein the gate oxide region and gate electrode are formed on a surface of the semiconductor substrate.

16. The method of claim 5, wherein the DMOS transistor comprises a trench type DMOS transistor, and wherein the gate oxide layer and the gate electrode are formed in a trench formed in the semiconductor substrate.

* * * * *